(12) United States Patent
Choi

(10) Patent No.: US 8,406,061 B2
(45) Date of Patent: Mar. 26, 2013

(54) SEMICONDUCTOR MEMORY APPARATUS

(75) Inventor: Jea Won Choi, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 320 days.

(21) Appl. No.: 12/841,014

(22) Filed: Jul. 21, 2010

(65) Prior Publication Data

US 2011/0267894 A1 Nov. 3, 2011

(30) Foreign Application Priority Data

Apr. 30, 2010 (KR) .................... 10-2010-0040660

(51) Int. Cl.
*G11C 11/4193* (2006.01)

(52) U.S. Cl. .................................. 365/185.25
(58) Field of Classification Search .............. 365/185.25
See application file for complete search history.

(56) References Cited

U.S. PATENT DOCUMENTS

| 7,200,039 | B2 | 4/2007 | Lee |
| 2004/0252555 | A1* | 12/2004 | Shor et al. ............... 365/185.22 |
| 2008/0049502 | A1 | 2/2008 | Byeon et al. |
| 2008/0158979 | A1 | 7/2008 | Kamei et al. |
| 2009/0129177 | A1 | 5/2009 | Roohparvar |

FOREIGN PATENT DOCUMENTS

| JP | 11-149789 | 6/1999 |
| JP | 2005-108399 | 4/2005 |
| KR | 1020060099142 | 9/2006 |

OTHER PUBLICATIONS

Osama Khouri et al., "Program Word-Line Voltage Generator for Multilevel Flash Memories", 2000 IEEE ICECS, ISBN: 0-7803-6542-9, pp. 1031-1033.

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor memory apparatus includes a voltage transfer unit configured to transfer a first word line control voltage among a plurality of word line control voltages to an assigned word line in a first operational period, and to transfer a second word line control voltage among the plurality of word line control voltages to the assigned word line in a second operational period; and a word line discharge unit configured to discharge the word line to a voltage level that is higher than a ground voltage and lower than the first and second word line control voltages in a discharge period between the first operational period and the second operational period.

25 Claims, 5 Drawing Sheets

SEMICONDUCTOR MEMORY APPARATUS

CROSS-REFERENCES TO RELATED APPLICATION

The present application claims priority under 35 U.S.C. §119(a) to Korean Application No. 10-2010-0040660, filed on Apr. 30, 2010, in the Korean Intellectual Property Office, which is incorporated herein by reference in its entirety as if set forth in full.

BACKGROUND

1. Technical Field

The present invention relates to a semiconductor memory apparatus, and more particularly, to a technology for discharging word lines.

2. Related Art

A semiconductor memory apparatus typically receives external power, generates internal voltages having various voltage levels, and operates internal circuits using these internal voltages. In particular, a nonvolatile memory apparatus such as a NAND flash memory generates a plurality of word line control voltages having different voltage levels, and transfers a specified word line control voltage to an assigned word line in each operation mode.

For example, a word line control voltage for a data programming operation has a very high voltage level. If the word line control voltage for data programming is transferred to a word line, corresponding memory cells coupled to the word line are programmed. In order to verify whether the memory cells are precisely programmed after the data programming operation, a word line control voltage for data reading is transferred to the word line to perform a data reading operation, and the data programmed to corresponding memory cells coupled to the word line are outputted. Generally, the data programming operation and the data reading operation are repeatedly performed until the memory cells are precisely programmed. For reference, the data reading operation for verifying whether the memory cells are precisely programmed is called a verify operation.

A word line discharge period occurs between the time period in which the word line control voltage for data programming is transferred to the word line and the time period in which the word line control voltage for data reading is transferred to the word line. In other words, during the word line discharge period after the supply of the word line control voltage of a high voltage level for data programming is interrupted and before the word line control voltage for data reading is supplied, the word line is usually discharged to a ground voltage (VSS).

The word line control voltage for data programming and the word line control voltage for data reading are generated by using charge pumping. When the word line is discharged to the ground voltage (VSS) while the control voltage of a high potential is repeatedly supplied, a substantial time is required to lower the word line to the level of the ground voltage (VSS). Further, a substantial time is required to re-elevate the word line lowered to the level of the ground voltage (VSS) to a specified level. Therefore, the operation of lowering the word line having the high voltage level to the level of the ground voltage and re-elevating the word line having the level of the ground voltage to the specified level is disadvantageous in terms of current consumption.

SUMMARY

In one embodiment of the present invention, a semiconductor memory apparatus includes: a voltage transfer unit configured to transfer a first word line control voltage among a plurality of word line control voltages to an assigned word line in a first operational period, and transfer a second word line control voltage among the plurality of word line control voltages to the is assigned word line in a second operational period; and a word line discharge unit configured to discharge the word line to a voltage level that is higher than a ground voltage and lower than the first and second word line control voltages in a discharge period between the first operational period and the second operational period.

In another embodiment of the present invention, a semiconductor memory apparatus includes: a voltage transfer unit configured to transfer a first word line control voltage among a plurality of word line control voltages to an assigned word line in a first operational period, and transfer a second word line control voltage among the plurality of word line control voltages to the assigned word line in a second operational period; a discharge control pulse generation unit configured to generate a first discharge control pulse signal which is activated during a predetermined initial period of a discharge period between the first operational period and the second operational period and a second discharge control pulse signal which is activated during the discharge period; a first word line discharge unit configured to discharge the word line to a ground voltage during an activation period of the first discharge control pulse signal; and a second word line discharge unit configured to discharge the word line to a voltage level that is higher than the ground voltage and lower than the first and second word line control voltages, during an activation period of the second discharge control pulse signal.

In another embodiment of the present invention, a semiconductor memory apparatus includes: a voltage transfer unit is configured to transfer a first word line control voltage among a plurality of word line control voltages to an assigned word line in a first operational period, and transfer a second word line control voltage among the plurality of word line control voltages to the assigned word line in a second operational period; a discharge control voltage generation unit configured to generate a discharge control voltage having a voltage level that corresponds to a code value of a control code; and a word line discharge unit configured to discharge the word line to a voltage level that is higher than a ground voltage and lower than the first and second word line control voltages in a discharge period between the first operational period and the second operational period, and control a slew rate at which the word line is discharged, depending upon a voltage level of the discharge control voltage.

BRIEF DESCRIPTION OF THE DRAWINGS

Features, aspects, and embodiments are described in conjunction with the attached drawings, in which.

DETAILED DESCRIPTION

A semiconductor memory apparatus according to the present invention is described below with reference to accompanying drawings through exemplary embodiments.

For reference, certain terms, symbols and signs used in drawings and in this detailed description to designate devices, blocks, and such may be used for detailed units as needed, it should be noted that the same terms, symbols or signs may not designate the same devices, blocks, or such in an entire circuitry. In general, the logic signals of a circuit and binary data values are divided into a high level (H) or a low level (L) in correspondence to voltage levels and may be represented as '1' and '0'. Meanwhile, the data value of a data signal can be represented differently in a single bit form or a multi-bit form depending upon a voltage level or a current magnitude.

Figure 1:
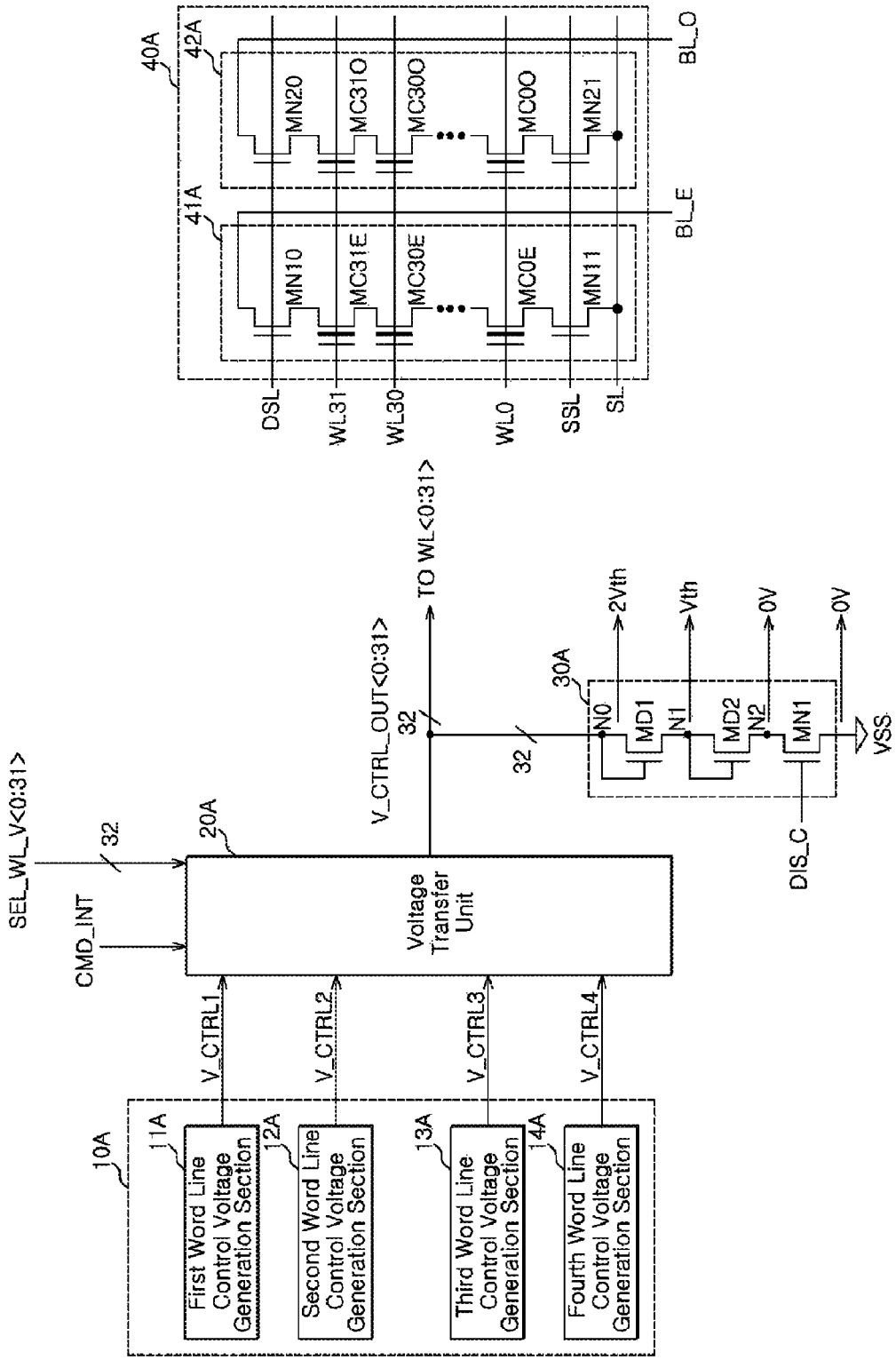
FIG. 1 is a configuration diagram illustrating a semiconductor memory apparatus in accordance with an embodiment of the present invention.

FIG. 1 is a configuration diagram illustrating a semiconductor memory apparatus in accordance with an embodiment of the present invention.

The semiconductor memory apparatus in accordance with an embodiment of the invention includes only a simplified configuration so that the technical principles may be clearly described.

Referring to FIG. 1, a semiconductor memory apparatus includes a word line control voltage generation unit 10A, a voltage transfer unit 20A, a word line discharge unit 30A, and a memory unit 40A.

The detailed configuration and principal operations of the semiconductor memory apparatus configured as mentioned above are described below.

The memory unit 40A is composed of a first memory string 41A and a second memory string 42A. In the semiconductor memory apparatus in accordance with an embodiment, limited numbers of word lines (WL), memory cells and bit lines are illustrated in order to clearly explain the principles of the invention.

The first memory string 41A is coupled to an even bit line BL_E, and the second memory string 42A is coupled to an odd bit line BL_O. A memory string is configured by having a plurality of memory cells coupled in series. The first memory string 41A is representatively described below. 32 nonvolatile memory cells MC0E through MC31E are coupled in series between a first selection transistor MN10 and a second selection transistor MN11. The first selection transistor MN10 is controlled by the voltage level of a first select signal line DSL, and the second selection transistor MN11 is controlled by the voltage level of a second select signal line SSL. The operation of the 32 nonvolatile memory cells MC0E through MC31E is controlled by a plurality of word line control voltages V_CTRL1, V_CTRL2, V_CTRL3 and V_CTRL4, which are transferred through word lines WL0 through WL31. In this embodiment of the present invention, the nonvolatile memory cells are composed of transistors which include control gates and floating gates.

The word line control voltage generation unit 10A is configured to generate the plurality of word line control voltages V_CTRL1, V_CTRL2, V_CTRL3 and V_CTRL4 having different voltage levels. In this embodiment of the present invention, the word line control voltage generation unit 10A generates the plurality of word line control voltages V_CTRL1, V_CTRL2, V_CTRL3 and V_CTRL4 through charge pumping. That is to say, a first word line control voltage V_CTRL1 generated by a first word line control voltage generation section 11A, a second word line control voltage V_CTRL2 generated by a second word line control voltage generation section 12A, a third word line control voltage V_CTRL3 generated by a third word line control voltage generation section 13A, and a fourth word line control voltage V_CTRL4 generated by a fourth word line control voltage generation section 14A are generated to have different voltage levels. The plurality of word line control voltages V_CTRL1, V_CTRL2, V_CTRL3 and V_CTRL4 are each transferred to word lines which are selected or unselected according to a data programming operation and/or a data reading operation.

The voltage transfer unit 20A is configured to transfer the first word line control voltage V_CTRL1 among the plurality of word line control voltages V_CTRL1, V_CTRL2, V_CTRL3 and V_CTRL4 to an assigned word line in a first operational period, and to transfer the second word line control voltage V_CTRL2 among the plurality of word line control voltages V_CTRL1, V_CTRL2, V_CTRL3 and V_CTRL4 to the assigned word line in a second operational period. The first operational period is defined as a data programming period, and the second operational period is defined as a data reading period.

The voltage transfer unit 20A is configured to transfer the plurality of word line control voltages V_CTRL1, V_CTRL2, V_CTRL3 and V_CTRL4 to assigned word lines in response to an internal command CMD_INT and word line voltage select signals SEL_WL_V<0:31>. The internal command CMD_INT and the word line voltage select signals SEL_WL_V<0:31> are signals which are outputted from a command control circuit.

First, when the internal command CMD_INT which commands the data programming operation is applied, the voltage transfer unit 20A transfers the plurality of respective word line control voltages V_CTRL1, V_CTRL2, V_CTRL3 and V_CTRL4 to assigned word lines under the control of the word line voltage select signals SEL_WL_V<0:31>. Word line control voltages for data programming among the plurality of word line control voltages V_CTRL1, V_CTRL2, V_CTRL3 and V_CTRL4 are transferred to word lines which are selected to perform the data programming operation, and word line control voltages, which have a voltage level lower than the word line control voltages for data programming, are transferred to unselected word lines. The memory cells coupled to the word lines to which the word line control voltages for data programming are transferred are programmed, and the memory cells coupled to the unselected word lines are not programmed.

Next, when the internal command CMD_INT which commands the data reading operation is applied, the voltage transfer unit 20A transfers the plurality of respective word line control voltages V_CTRL1, V_CTRL2, V_CTRL3 and V_CTRL4 to assigned word lines under the control of the word line voltage select signals SEL_WL_V<0:31>. Word line control voltages for data reading among the plurality of word line control voltages V_CTRL1, V_CTRL2, V_CTRL3 and V_CTRL4 are transferred to word lines which are selected to perform the data reading operation, and word line control voltages, which have a voltage level higher than the word line control voltages for data reading, are transferred to unselected word lines. The memory cells coupled to the word lines, to which the word line control voltages for data reading are transferred, output programmed data through a bit line.

The word line discharge unit 30A is configured to discharge a word line to a voltage level that is higher than a ground voltage VSS and lower than the word line control voltage for data programming and the word line control voltage for data reading, during a discharge period between the first operational period and the second operational period, or, in other words, between the data is programming period and the data reading period. The voltage level of the ground voltage VSS is defined as 0V. In this embodiment, the word line discharge unit 30A is composed of a first MOS diode MD1 coupled between a word line (WL) and a first node N1, a second MOS diode MD2 coupled between the first node N1 and a second node N2, and an NMOS transistor MN1 coupled between the second node N2 and a terminal of the ground voltage VSS, and is controlled by a discharge signal DIS_C. The discharge signal DIS_C is a signal which is outputted from the command control circuit. Accordingly, if the discharge signal DIS_C is activated to a high level, the NMOS transistor MN1 is turned on and the word line is discharged. A level to which the word line is finally discharged is determined by the threshold voltage Vth of the first MOS diode MD1 and the second MOS diode MD2. For reference, the number of diodes provided in the word line discharge unit 30A may vary from one embodiment to another.

Figure 2:
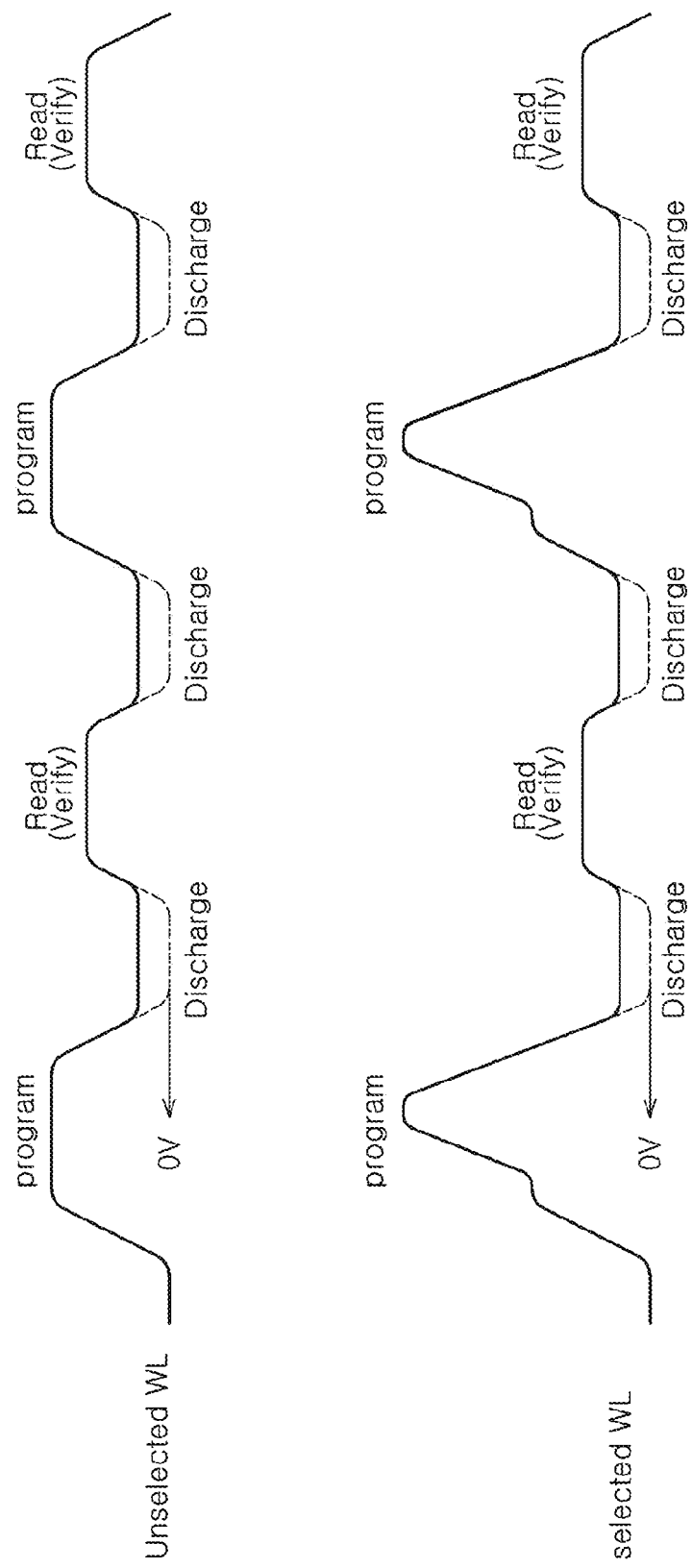
FIG. 2 is a diagram illustrating changes in the voltage levels of word lines in the semiconductor memory apparatus shown in FIG. 1.

FIG. 2 is a diagram illustrating changes in the voltage levels of word lines in the semiconductor memory apparatus shown in FIG. 1.

The internal operations of the semiconductor memory apparatus configured as mentioned above is described below with reference to FIGS. 2 and 3.

FIG. 2 shows changes in voltage levels of a selected word line 'selected WL' for the data programming operation and of an unselected word line 'Unselected WL'. As representation of those changes, changes in the voltage level of the selected word line 'selected WL' are described below.

A semiconductor memory apparatus repeatedly performs the data programming operation and the data reading operation to precisely program memory cells. The data reading operation corresponds to a verify operation.

First, the semiconductor memory apparatus transfers a word line control voltage for data programming to the selected word line 'selected WL' during the data programming period.

Next, the semiconductor memory apparatus discharges the selected word line 'selected WL' to a voltage level higher than the ground voltage VSS during the discharge period after the data programming period.

Thereafter, the semiconductor memory apparatus transfers a word line control voltage for data reading to the selected word line 'selected WL' during the data reading period after the discharge period.

The word line discharge unit 30A discharges the selected word line 'selected WL' to the voltage level higher than the ground voltage VSS during the discharge period. The final discharge level of the word line may be set lower than the word line control voltage for data programming and the word line control voltage for data reading.

Since the selected word line 'selected WL' is discharged to the level higher than the ground voltage VSS during the discharge period, the time it takes to raise the voltage level of the word line is during the data reading period after the discharge period, as well as the current consumption, can be reduced. As the operation of discharging the unselected word line 'Unselected WL' is also performed according to the above-described operation, it will not be described again.

Figure 3:
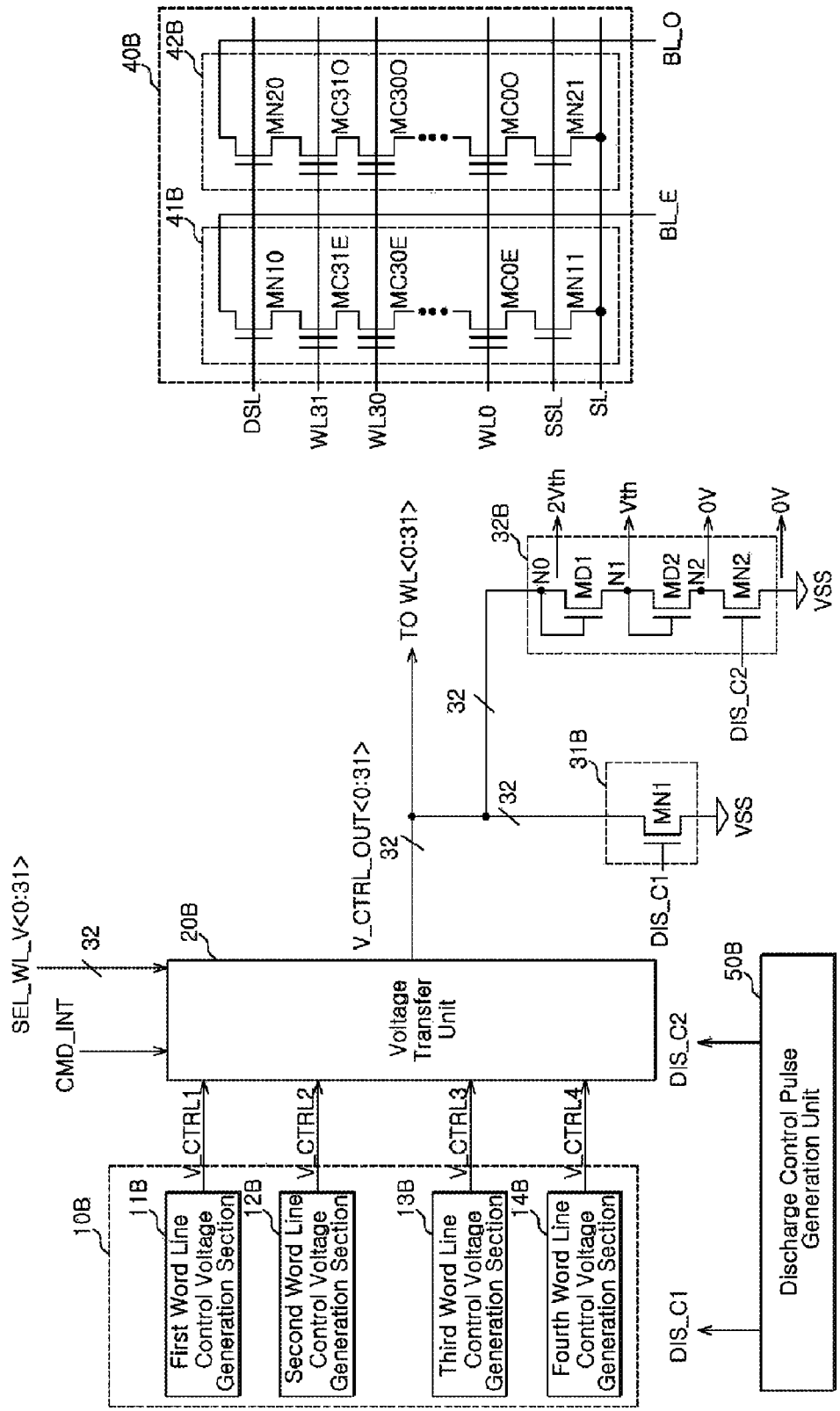
FIG. 3 is a configuration diagram illustrating a semiconductor memory apparatus in accordance with another embodiment of the present invention.

FIG. 3 is a diagram illustrating the configuration of a semiconductor memory apparatus in accordance with another embodiment of the present invention.

The semiconductor memory apparatus in accordance with this embodiment of the present invention includes only a simplified configuration for the purpose of clearly describing the technical principles.

Referring to FIG. 3, a semiconductor memory apparatus includes a word line control voltage generation unit 10B, a voltage transfer unit 20B, a first word line discharge unit 31B, a second word line discharge unit 32B, a memory unit 40B, and a discharge control pulse generation unit 50B.

The detailed configuration and principal operations of the semiconductor memory apparatus configured as mentioned above are described below.

The memory unit 40B is composed of a first memory string 41B and a second memory string 42B. In the semiconductor memory apparatus in accordance with this embodiment of the present invention, a limited number of word lines (WL), memory cells and bit lines are illustrated in order to clearly explain the invention, The first memory string 41B is coupled to an even bit line BL_E, and the second memory string 42B is coupled to an odd bit line BL_O. A memory string is configured by having a plurality of memory cells coupled in series. The first memory string 41B is representatively described below. 32 nonvolatile memory cells MC0E through MC31E are coupled in series between a first selection transistor MN10 and a second selection transistor MN11. The first selection transistor MN10 is controlled by the voltage level of a first select signal line DSL, and the second selection transistor MN11 is controlled by the voltage level of a second select signal line SSL. The operations of the 32 nonvolatile memory cells MC0E through MC31E are controlled by a plurality of word line control voltages V_CTRL1, V_CTRL2, V_CTRL3 and V_CTRL4 which are transferred through word lines WL0 through WL31. In this embodiment of the present invention, the nonvolatile memory cells are composed of transistors which include control gates and floating gates.

The word line control voltage generation unit 10B is configured to generate the plurality of word line control voltages V_CTRL1, V_CTRL2, V_CTRL3 and V_CTRL4 having different voltage levels. In this embodiment of the present invention, the word line control voltage generation unit 10B generates the plurality of word line control voltages V_CTRL1, V_CTRL2, V_CTRL3 and V_CTRL4 through charge pumping. In other words, a first word line control voltage V_CTRL1 generated by a first word line control voltage generation section 11B, a second word line control voltage V_CTRL2 generated by a second word line control voltage generation section 12B, a third word line control voltage V_CTRL3 generated by a third word line control voltage generation section 13B, and a fourth word line control voltage V_CTRL4 generated by a fourth word line control voltage generation section 14B are generated to have different voltage levels. The plurality of word line control voltages V_CTRL1, V_CTRL2, V_CTRL3 and V_CTRL4 are each transferred to word lines which are selected or unselected according to a data programming operation and/or a data reading operation.

The voltage transfer unit 20B is configured to transfer the first word line control voltage V_CTRL1 among the plurality of word line control voltages V_CTRL1, V_CTRL2, V_CTRL3 and V_CTRL4 to an assigned word line in a first operational period, and to transfer the second word line control voltage V_CTRL2 among the plurality of word line control voltages V_CTRL1, V_CTRL2, V_CTRL3 and V_CTRL4 to assigned word line in a second operational period. The first operational period is defined as a data programming period, and the second operational period is defined as a data reading period.

The voltage transfer unit 20B transfers the plurality of word line control voltages V_CTRL1, V_CTRL2, V_CTRL3 and V_CTRL4 to assigned word lines in response to an internal command CMD_INT and word line voltage select signals SEL_WL_V<0:31>. The internal command CMD_INT and the word line voltage select signals SEL_WL_V<0:31> are signals outputted from a command control circuit.

First, if the internal command CMD_INT which commands the data programming operation is applied, the voltage transfer unit 20B transfers the plurality of respective word line control voltages V_CTRL1, V_CTRL2, V_CTRL3 and V_CTRL4 to assigned word lines under the control of the word line voltage select signals SEL_WL_V<0:31>. Word line control voltages for data programming among the plurality of word line control voltages V_CTRL1, V_CTRL2, V_CTRL3 and V_CTRL4 are transferred to word lines which are selected to perform the data programming operation, and word line control voltages, which have a voltage level lower than the word line control voltages for data programming, are transferred to unselected word lines. The memory cells coupled to the word lines to which the word line control voltages for data programming are transferred are programmed, and the memory cells coupled to the unselected word lines are not programmed.

First, when the internal command CMD_INT which commands the data reading operation is applied, the voltage transfer unit 20B transfers the plurality of respective word line control voltages V_CTRL1, V_CTRL2, V_CTRL3 and V_CTRL4 to assigned word lines under the control of the word line voltage select signals SEL_WL_V<0:31>. Word line control voltages for data reading among the plurality of word line control voltages V_CTRL1, V_CTRL2, V_CTRL3 and V_CTRL4 are transferred to word lines which are selected to perform the data reading operation, and word line control voltages, which have a voltage level higher than the word line control voltages for data reading, are transferred to unselected word lines. The memory cells coupled to the word lines, to which the word line control voltages for data reading are transferred, output programmed data through a bit line.

The discharge control pulse generation unit 50B is configured to generate a first discharge control pulse signal DIS_C1, which is activated during a predetermined initial period of the discharge period between the first operational period and the second operational period, and a second discharge control pulse signal DIS_C2, which is activated during the discharge period.

The first word line discharge unit 31B is configured to discharge a word line (WL) to a ground voltage VSS during the activation period of the first discharge control pulse signal DIS_C1. The first word line discharge unit 31B includes an NMOS transistor MN1 which is coupled between the word line (WL) and the terminal of the ground voltage VSS and is controlled by the first discharge control pulse signal DIS_C1.

The second word line discharge unit 32B is configured to discharge a word line (WL) to a voltage level that is higher than the ground voltage VSS and lower than the word line control voltage for data programming and the word line control voltage for data reading, during the activation period of the second discharge control pulse signal DIS_C2. The second word line discharge unit 32B is composed of a first MOS diode MD1 coupled between the word line (WL) and a first node N1, a second MOS diode MD2 coupled between the first is node N1 and a second node N2, and an NMOS transistor MN2 coupled between the second node N2 and the terminal of the ground voltage VSS, and is controlled by the second discharge control pulse signal DIS_C2. It should be noted that the number of diodes that are provided in the second word line discharge unit 30B may vary from one embodiment to next.

Figure 4:
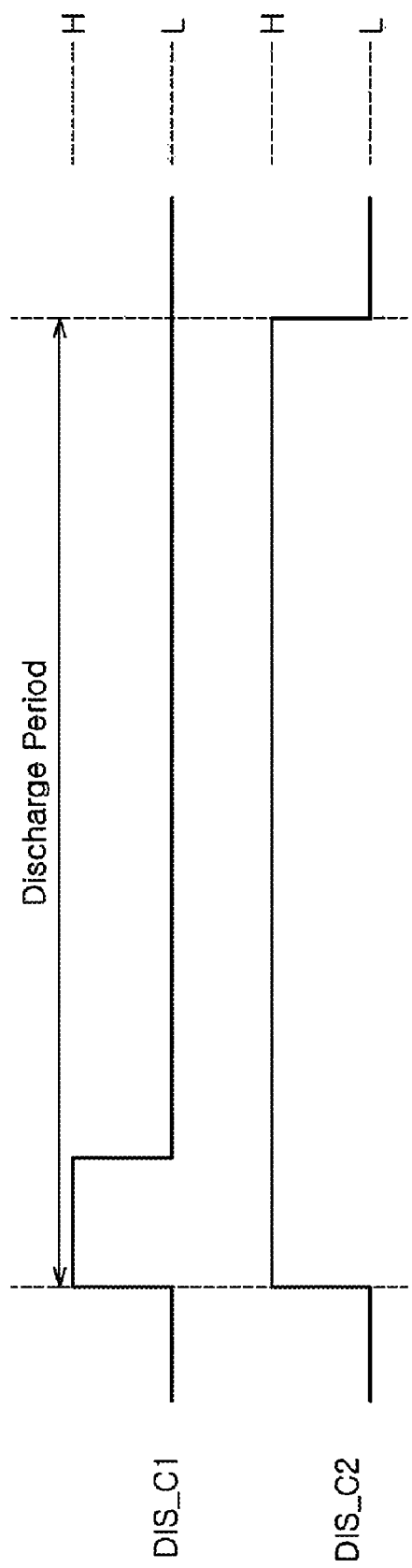
FIG. 4 is a diagram illustrating the operation of a discharge control pulse generation unit shown in FIG. 3.

FIG. 4 is a diagram illustrating the operation of the discharge control pulse generation unit shown in FIG. 3.

The internal operations of the semiconductor memory apparatus configured as mentioned above is described below with reference to FIGS. 3 and 4.

The first discharge control pulse signal DIS_C1 is a signal activated during the predetermined initial period of the discharge period. The second discharge control pulse signal DIS_C2 are a signal activated during the discharge period. Accordingly, during the predetermined initial period of the discharge period, a selected word line 'selected WL' is quickly discharged through the first word line discharge unit 31B and the second word line discharge unit 32B, at the same time. Also, during the discharge period after the predetermined initial period, the selected word line 'selected WL' is discharged to a level higher than the ground voltage through the second word line discharge unit 32B. The final discharge level of the word line may be set lower than the word line control voltage for data programming and the word line control voltage for data reading.

Since the selected word line 'selected WL' is quickly is discharged by simultaneously using the ground voltage VSS in the predetermined initial period of the discharge period and is then discharged to a level higher than the ground voltage VSS during the remaining discharge period, the time it takes to raise the voltage level of the word line during the data reading period after the discharge period, as well as the current consumption, can be reduced.

Figure 5:
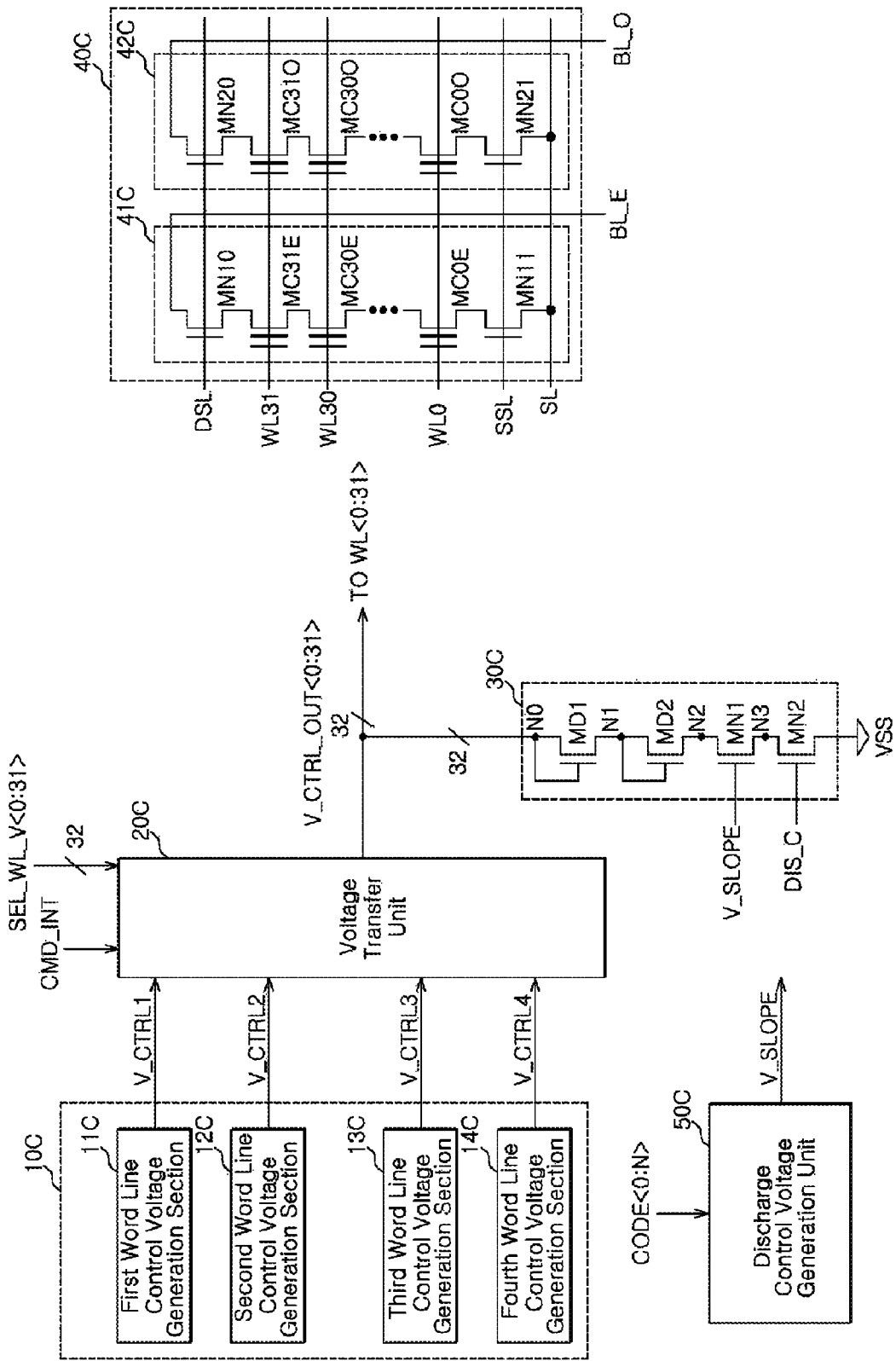
FIG. 5 is a configuration diagram illustrating a semiconductor memory apparatus in accordance with another embodiment of the present invention.

FIG. 5 is a configuration diagram illustrating a semiconductor memory apparatus in accordance with another embodiment of the present invention.

The semiconductor memory apparatus in accordance with the embodiment of the present invention includes only a simplified configuration for the purpose of clearly describing the technical principles.

Referring to FIG. 5, a semiconductor memory apparatus includes a word line control voltage generation unit 10C, a voltage transfer unit 20C, a word line discharge unit 30C, a memory unit 40C, and a discharge control voltage generation unit 50C.

The detailed configuration and principal operations of the semiconductor memory apparatus configured as mentioned above is described below.

The memory unit 40C is composed of a first memory string 41C and a second memory string 42C. In the semiconductor memory apparatus in accordance with this embodiment of the present invention, a limited number of word lines (WL), memory cells and bit lines are illustrated in order to clearly explain the invention.

The first memory string 41C is coupled to an even bit line BL_E, and the second memory string 42C is coupled to an odd bit line BL_O. A memory string is configured by having a plurality of memory cells coupled in series. The first memory string 41C is representatively described below. 32 nonvolatile memory cells MC0E through MC31E are coupled in series between a first selection transistor MN10 and a second selection transistor MN11. The first selection transistor MN10 is controlled by the voltage level of a first select signal line DSL, and the second selection transistor MN11 is controlled by the voltage level of a second select signal line SSL. The operations of the 32 nonvolatile memory cells MC0E through MC31E are controlled by a plurality of word line control voltages V_CTRL1, V_CTRL2, V_CTRL3 and V_CTRL4 which are transferred through word lines WL0 through WL31. In this embodiment of the present invention, the nonvolatile memory cells are composed of transistors which include control gates and floating gates.

The word line control voltage generation unit 10C is configured to generate the plurality of word line control voltages V_CTRL1, V_CTRL2, V_CTRL3 and V_CTRL4 having different voltage levels. In this embodiment of the present invention, the word line control voltage generation unit 10C generates the plurality of word line control voltages V_CTRL1, V_CTRL2, V_CTRL3 and V_CTRL4 through charge pumping. In other words, a first word line control voltage V_CTRL1 generated by a first word line control voltage generation section 11C, a second word line control voltage V_CTRL2 generated by a second word line control voltage generation section 12C, a third word line control voltage V_CTRL3 generated by a third word line control voltage generation section 13C, and a fourth word line control voltage V_CTRL4 generated by a fourth word line control voltage generation section 14C are generated to have different voltage levels. The plurality of word line control voltages V_CTRL1, V_CTRL2, V_CTRL3 and V_CTRL4 are each transferred to word lines which are selected or unselected according to a data programming operation and a data reading operation.

The voltage transfer unit 20C is configured to transfer the first word line control voltage V_CTRL1 among the plurality of word line control voltages V_CTRL1, V_CTRL2, V_CTRL3 and V_CTRL4 to an assigned word line in a first operational period and transfer the second word line control voltage V_CTRL2 among the plurality of word line control voltages V_CTRL1, V_CTRL2, V_CTRL3 and V_CTRL4 to the assigned word line in a second operational period. The first operational period is defined as a data programming period, and the second operational period is defined as a data reading period.

The voltage transfer unit 20C transfers the plurality of word line control voltages V_CTRL1, V_CTRL2, V_CTRL3 and V_CTRL4 to assigned word lines in response to an internal command CMD_INT and word line voltage select signals SEL_WL_V<0:31>. The internal command CMD_INT and the word line voltage select signals SEL_WL_V<0:31> are signals outputted from a command control circuit.

First, when the internal command CMD_INT which commands the data programming operation is applied, the voltage transfer unit 20C transfers the plurality of respective word line control voltages V_CTRL1, V_CTRL2, V_CTRL3 and V_CTRL4 to assigned word lines under the control of the word line voltage select signals SEL_WL_V<0:31>. Word line control voltages for data programming among the plurality of word line control voltages V_CTRL1, V_CTRL2, V_CTRL3 and V_CTRL4 are transferred to word lines which are selected to perform the data programming operation. Word line control voltages having a voltage level lower than the word line control voltages for data programming are transferred to unselected word lines. The memory cells coupled to the word lines to which the word line control voltages for data programming are transferred are programmed, and the memory cells coupled to the unselected word lines are not programmed.

Next, when the internal command CMD_INT which commands the data reading operation is applied, the voltage transfer unit 20C transfers the plurality of respective word line control voltages V_CTRL1, V_CTRL2, V_CTRL3 and V_CTRL4 to assigned word lines under the control of the word line voltage select signals SEL_WL_V<0:31>. Word line control voltages for data reading among the plurality of word line control voltages V_CTRL1, V_CTRL2, V_CTRL3 and V_CTRL4 are transferred to word lines which are selected to perform the data reading operation. Word line control voltages having a voltage level higher than the word line control voltages for data reading are transferred to unselected word lines. The memory cells coupled to the word lines, to which the word line control voltages for data reading are transferred, output programmed data through a bit line.

The discharge control voltage generation unit 50C is configured to generate a discharge control voltage V_SLOPE which has a voltage level corresponding to the code value of a control code CODE<0:N>. The control code CODE<0:N> can be defined as a signal which is outputted from a mode register set (MRS), and may be defined as a code which is directly inputted from an outside or a signal which is outputted from the command control circuit.

The word line discharge unit 30C is configured to discharge a word line to a voltage level that is higher than a ground voltage VSS and lower than the word line control voltage for data programming and the word line control voltage for data reading, during a discharge period between the first operational period and the second operational period, that is, between the data programming period and the data reading period. The word line discharge unit 30C controls a slew rate at which the word line is discharged, depending upon the voltage level of the discharge control voltage V_SLOPE.

In this embodiment, the word line discharge unit 30C is composed of a first MOS diode MD1 coupled between a word line (WL) and a first node N1, a second MOS diode MD2 coupled between the first node N1 and a second node N2, a first NMOS transistor MN1 coupled between the second node N2 and a third node N3, and is controlled by the discharge control voltage V_SLOPE; and a second NMOS transistor MN2 coupled between the third node N3 and the terminal of the ground voltage VSS, and is controlled by a discharge signal DIS_C. The discharge signal DIS_C is a signal, which is a type of enable signal and activated to a high level during the discharge period. The first NMOS transistor MN1, which is controlled by the discharge control voltage V_SLOPE, controls a current driving intensity between the second node N2 and the third node N3 depending upon the voltage level of the discharge control voltage V_SLOPE, and through this, the slew rate of the word line is controlled. It should be noted that the number of diodes provided in the word line discharge unit 30C may vary from one embodiment to next.

The word line discharge unit 30C discharges the selected word line 'selected WL' to the voltage level higher than the ground voltage VSS during the discharge period. The final discharge level of the word line may be set lower than the word line control voltage for data programming and the word line control voltage for data reading.

Since the selected word line 'selected WL' is discharged to the level higher than the ground voltage VSS during the discharge period, the time it takes to raise the voltage level of the word line during the data reading period after the discharge period, as well as the current consumption, can be reduced. Also, a slew rate at which the word line is discharged can be controlled through the discharge control voltage V_SLOPE.

As described above, in the semiconductor memory apparatuses in accordance with the embodiments of the present invention, the time it takes to discharge word lines can be shortened. Also, the amount of current needed for discharging the word lines can be reduced. Further, a slew rate at which the word lines are discharged can be controlled.

While certain embodiments have been described above, it those skilled in the art will understand that the embodiments described are examples only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a voltage transfer unit configured to transfer a first word line control voltage among a plurality of word line control voltages to an assigned word line in a first operational period, and to transfer a second word line control voltage among the plurality of word line control voltages to the assigned word line in a second operational period; and
   a word line discharge unit configured to discharge the word line to a voltage level that is higher than a ground voltage and lower than the first and second word line control voltages during a discharge period between the first operational period and the second operational period, and further comprises:
   a first diode coupled between the word line and a first node;
   a second diode coupled between the first node and a second node; and
   a transistor coupled between the second node and a terminal of the ground voltage and controlled by a discharge signal.

2. The semiconductor memory apparatus according to claim 1, further comprising:
   a word line control voltage generation unit configured to generate the plurality of word line control voltages each having different voltage levels.

3. The semiconductor memory apparatus according to claim 1, wherein memory cells which are connected to the word line comprise nonvolatile memory cells.

4. The semiconductor memory apparatus according to claim 3, wherein each of the nonvolatile memory cells comprises a transistor having a control gate and a floating gate.

5. The semiconductor memory apparatus according to claim 1, wherein the first operational period comprises a data programming period, and the second operational period comprises a data reading period.

6. The semiconductor memory apparatus according to claim 2, wherein the word line control voltage generation unit generates the plurality of word line control voltages through charge pumping.

7. The semiconductor memory apparatus according to claim 1, wherein the voltage transfer unit transfers each of the plurality of word line control voltages to its respectively assigned word line in response to an internal command and word line voltage select signals.

8. A semiconductor memory apparatus comprising:
   a voltage transfer unit configured to transfer a first word line control voltage among a plurality of word line control voltages to an assigned word line in a first operational period, and to transfer a second word line control voltage among the plurality of word line control voltages to the assigned word line in a second operational period;
   a discharge control pulse generation unit configured to generate a first discharge control pulse signal which is activated during a predetermined initial period of a discharge period between the first operational period and the second operational period, and a second discharge control pulse signal which is activated during the discharge is period;
   a first word line discharge unit configured to discharge the word line to a ground voltage during an activation period of the first discharge control pulse signal; and
   a second word line discharge unit configured to discharge the word line to a voltage level that is higher than the ground voltage and lower than the first and second word line control voltages, during an activation period of the second discharge control pulse signal.

9. The semiconductor memory apparatus according to claim 8, further comprising:
   a word line control voltage generation unit configured to generate the plurality of word line control voltages having different voltage levels.

10. The semiconductor memory apparatus according to claim 8, wherein memory cells which are connected to the word line comprise nonvolatile memory cells.

11. The semiconductor memory apparatus according to claim 10, wherein each of the nonvolatile memory cells comprises a transistor having a control gate and a floating gate.

12. The semiconductor memory apparatus according to claim 8, wherein the first operational period comprises a data programming period, and the second operational period comprises a data reading period.

13. The semiconductor memory apparatus according to claim 9, wherein the word line control voltage generation unit generates the plurality of word line control voltages through charge pumping.

14. The semiconductor memory apparatus according to claim 8, wherein the voltage transfer unit transfers each of the plurality of word line control voltages to its respectively assigned word lines in response to an internal command and word line voltage select signals.

15. The semiconductor memory apparatus according to claim 8, wherein the first word line discharge unit comprises a transistor which is coupled between the word line and a terminal of the ground voltage and is controlled by the first discharge control pulse signal.

16. The semiconductor memory apparatus according to claim 8, wherein the second word line discharge unit comprises:
    a first diode coupled between the word line and a first node;
    a second diode coupled between the first node and a second node; and
    a transistor coupled between the second node and the terminal of the ground voltage and controlled by the second discharge control is pulse signal.

17. A semiconductor memory apparatus comprising:
    a voltage transfer unit configured to transfer a first word line control voltage among a plurality of word line control voltages to an assigned word line in a first operational period, and to transfer a second word line control voltage among the plurality of word line control voltages to the assigned word line in a second operational period;
    a discharge control voltage generation unit configured to generate a discharge control voltage having a voltage level that corresponds to a code value of a control code, wherein the control code is a code which is outputted from a mode register set; and
    a word line discharge unit configured to discharge the word line to a voltage level that is higher than a ground voltage and lower than the first and second word line control voltages in a discharge period between the first operational period and the second operational period, and control a slew rate at which the word line is discharged, depending upon a voltage level of the discharge control voltage.

18. The semiconductor memory apparatus according to claim 17, further comprising:
    a word line control voltage generation unit configured to generate the plurality of word line control voltages having different voltage levels.

19. The semiconductor memory apparatus according to claim 17, wherein memory cells which are connected to the word line comprise nonvolatile memory cells.

20. The semiconductor memory apparatus according to claim 19, wherein each of the nonvolatile memory cells comprises a transistor having a control gate and a floating gate.

21. The semiconductor memory apparatus according to claim 17, wherein the first operational period comprises a data programming period, and the second operational period comprises a data reading period.

22. The semiconductor memory apparatus according to claim 18, wherein the word line control voltage generation unit generates the plurality of word line control voltages through charge pumping.

23. The semiconductor memory apparatus according to claim 17, wherein the voltage transfer unit transfers each of the plurality of word line control voltages to its respectively assigned word lines in response to an internal command and word line voltage select signals.

24. The semiconductor memory apparatus according to claim 17, wherein the word line discharge unit comprises:
    a first diode coupled between the word line and a first node;
    a second diode coupled between the first node and a second node;
    a first transistor coupled between the second node and a third node and controlled by the discharge control voltage; and
    a second transistor coupled between the third node and a terminal of the ground voltage and controlled by a discharge signal.

25. The semiconductor memory apparatus according to claim 17, wherein the control code is a code which is outputted from a command control circuit.

\* \* \* \* \*